(12) United States Patent
Cok et al.

(10) Patent No.: US 7,994,714 B2
(45) Date of Patent: Aug. 9, 2011

(54) DISPLAY DEVICE WITH CHIPLETS AND LIGHT SHIELDS

(75) Inventors: Ronald S. Cok, Rochester, NY (US); Gary J Parrett, Rochester, NY (US)

(73) Assignee: Global OLED Technology LLC, Herndon, VA (US)

(*) Notice: Subject to any disclaimer, the term of this patent is extended or adjusted under 35 U.S.C. 154(b) by 42 days.

(21) Appl. No.: 12/369,163

(22) Filed: Feb. 11, 2009

(65) Prior Publication Data

US 2010/0201253 A1 Aug. 12, 2010

(51) Int. Cl.
*H01J 1/62* (2006.01)
(52) U.S. Cl. ......................... 313/506; 313/498
(58) Field of Classification Search .................. 313/498, 313/506, 509
See application file for complete search history.

(56) References Cited

U.S. PATENT DOCUMENTS

| 6,384,529 | B2 | 5/2002 | Tang |
| 6,525,341 | B1 | 2/2003 | Tsujimura et al. |
| 6,636,284 | B2 | 10/2003 | Sato |
| 6,746,905 | B1 | 6/2004 | Fukuda |
| 6,958,740 | B1 | 10/2005 | Nishikawa ................... 345/76 |
| 2002/0078559 | A1 | 6/2002 | Buchwalter et al. ......... 29/832 |
| 2003/0011738 | A1 | 1/2003 | Akiyama et al. ............ 349/156 |
| 2006/0055864 | A1 | 3/2006 | Matsumura et al. |
| 2007/0069205 | A1 | 3/2007 | Jinno ........................ 257/40 |

*Primary Examiner* — Vip Patel
(74) *Attorney, Agent, or Firm* — Morgan, Lewis & Bockius LLP

(57) ABSTRACT

A light-emitting diode display device includes a transparent substrate; a plurality of chiplets located over the substrate between a transparent electrode and the substrate, each chiplet including drive circuitry for driving pixels to emit light and including a storage capacitor for storing charge and wherein light illumination of at least a portion of the drive circuit causes the capacitor to leak charge; a connection pad forming a first light shield separate from the drive circuitry located on the surface of each chiplet disposed over the drive circuitry and substantially shielding at least a portion of the drive circuitry from illumination, the connection pad electrically connected to the drive circuitry, and a second light shield disposed under the drive circuitry between the drive circuitry and the substrate to shield at least a portion of the drive circuitry from illumination.

16 Claims, 6 Drawing Sheets

DISPLAY DEVICE WITH CHIPLETS AND LIGHT SHIELDS

FIELD OF THE INVENTION

The present invention relates to display devices having a substrate with distributed, independent chiplets for controlling a pixel array.

BACKGROUND OF THE INVENTION

Flat-panel display devices are widely used in conjunction with computing devices, in portable devices, and for entertainment devices such as televisions. Such displays typically employ a plurality of pixels distributed over a substrate to display images. Each pixel incorporates several, differently colored light-emitting elements commonly referred to as sub-pixels, typically emitting red, green, and blue light, to represent each image element. As used herein, pixels and sub-pixels are not distinguished and refer to a single light-emitting element. A variety of flat-panel display technologies are known, for example plasma displays, liquid crystal displays, and light-emitting diode (LED) displays.

Light emitting diodes (LEDs) incorporating in films of light-emitting materials forming light-emitting elements have many advantages in a flat-panel display device and are useful in optical systems. U.S. Pat. No. 6,384,529 issued May 7, 2002 to Tang et al. shows an organic LED (OLED) color display that includes an array of organic LED light-emitting elements. Alternatively, inorganic materials can be employed and can include phosphorescent crystals or quantum dots in a polycrystalline semiconductor matrix. Other thin films of organic or inorganic materials can also be employed to control charge injection, transport, or blocking to the light-emitting-thin-film materials, and are known in the art. The materials are placed upon a substrate between electrodes, with an encapsulating cover layer or plate. Typically, one of the electrodes is transparent and the other reflective. Light is emitted from a pixel when current passes through the light-emitting material and passes through the transparent electrode and out of the device. If the bottom electrode and substrate are transparent, the device is a bottom emitter. If the top electrode and cover are transparent, the device is a top emitter. The frequency of the emitted light is dependent on the nature of the material used. In such a display, light can be emitted through the substrate (a bottom emitter) or through the encapsulating cover (a top emitter), or both. It is well known that light emitted from the high-index organic layers is trapped in the organic layers, the transparent electrode, and a transparent substrate (in a bottom-emitter configuration) due to the relatively high indices of refraction of those materials compared to air.

In an active-matrix device, active control elements are formed of thin films of semiconductor material, for example amorphous or poly-crystalline silicon, coated over the flat-panel substrate. Typically, each sub-pixel is controlled by one control element and each control element includes at least one transistor. For example, in a simple active-matrix organic light-emitting (OLED) display, each control element includes two transistors (a select transistor and a power transistor) and one capacitor for storing a charge specifying the luminance of the sub-pixel. Each light-emitting element typically employs an independent control electrode and an electrode electrically connected in common. Control of the light-emitting elements is typically provided through a data signal line, a select signal line, a power connection and a ground connection.

One common, prior-art method of forming active-matrix control elements typically deposits in films of semiconductor materials, such as silicon, onto a glass substrate and then forms the semiconductor materials into transistors and capacitors through photolithographic processes. The thin-film silicon can be either amorphous or polycrystalline. Thin-film transistors (TFTs) made from amorphous or polycrystalline silicon are relatively large and have lower performance compared to conventional transistors made in crystalline silicon wafers. Moreover, such thin-film devices typically exhibit local or large-area non-uniformity across the glass substrate that results in non-uniformity in the electrical performance and visual appearance of displays employing such materials. In such active-matrix designs, each light-emitting element requires a separate connection to a driving circuit. The behavior of silicon transistors, made in either thin films or in crystalline silicon, changes in the presence of electromagnetic radiation, including visible light. Typically, exposing the thin-film transistors to light increases the carrier density in the transistors, causing more current to pass through the transistor. This, in turn, can increase the amount of current passed through light-emitting diodes, for example in organic light emitting diode displays. These changes in current cause non-uniformities in the display, increased or decreased brightness, or other unacceptable display behaviors.

This problem can be addressed in a thin-film transistor circuit by forming a light-shield on the substrate to shield transistors from light in an LCD, as disclosed in U.S. Pat. No. 6,525,341 issued Feb. 25, 2003 to Tsujimura, et al. A metal gate electrode is also disclosed that can serve to shield a transistor junction from light. U.S. Pat. No. 6,746,905 issued Jun. 8, 2004 to Fukuda discloses a light shield layer including an amorphous silicon carbide layer located below thin-film transistors. However, these structures can be limited to thin-film circuit designs on substrates. U.S. Pat. No. 6,636,284 issued Oct. 21, 2003 to Sato describes an electro-optical device with TFTs that includes an upper light shield layer and a lower light shield for an LCD. The upper light shield is formed in a grid-like configuration above the TFTs and can include a capacitor layer or conductive traces such as a data line or capacitive line. The lower light shield is formed on the substrate beneath the TFTs. This arrangement requires that conductive lines or a circuit capacitor be located directly above the TFTs, therefore limits the circuit layout, requires more processing layers than are desirable and might not be useful in other circuit designs and circuit manufacturing processes.

Employing an alternative control technique, Matsumura et al., in U.S. Patent Application No. 2006/0055864, describe crystalline silicon substrates used for driving LCD displays. The application describes a method for selectively transferring and affixing pixel-control devices made from first semiconductor substrates onto a second planar display substrate. Wiring interconnections within the pixel-control device and connections from busses and control electrodes to the pixel-control device are shown. However, there is no teaching of structures or methods for preventing light exposure to circuits in such a pixel-control device.

There is a need, therefore, for an improved structure for display devices employing LEDs and high-performance circuits that overcomes any problems with circuit performance changes in response to light exposure.

SUMMARY OF THE INVENTION

In accordance with the present invention, there is provided a light-emitting diode display device, comprising:

a) a transparent substrate;

b) a plurality of pixels formed on the substrate, each pixel including a transparent electrode formed over the transparent substrate, one or more layers of light-emitting material formed over the transparent electrode, and an electrode formed over the one or more layers of light-emitting material;

c) a plurality of chiplets located over the substrate between the transparent electrode and the substrate, each chiplet including drive circuitry for driving the pixel to emit light, the drive circuitry including a storage capacitor for storing charge and wherein light illumination of at least a portion of the drive circuit causes the capacitor to leak charge;

d) a connection pad forming a first light shield separate from the drive circuitry located on the surface of each chiplet disposed over the drive circuitry and substantially shielding at least a portion of the drive circuitry from illumination, the connection pad electrically connected to the drive circuitry, and e) a second light shield disposed under the drive circuitry between the drive circuitry and the substrate to shield at least a portion of the drive circuitry from illumination.

Advantages

The present invention has the advantage that, by providing first and second light shields with a chiplet-controlled light-emitting diode display, electromagnetic interference is reduced and performance and stability of the display are enhanced.

Figure 1:
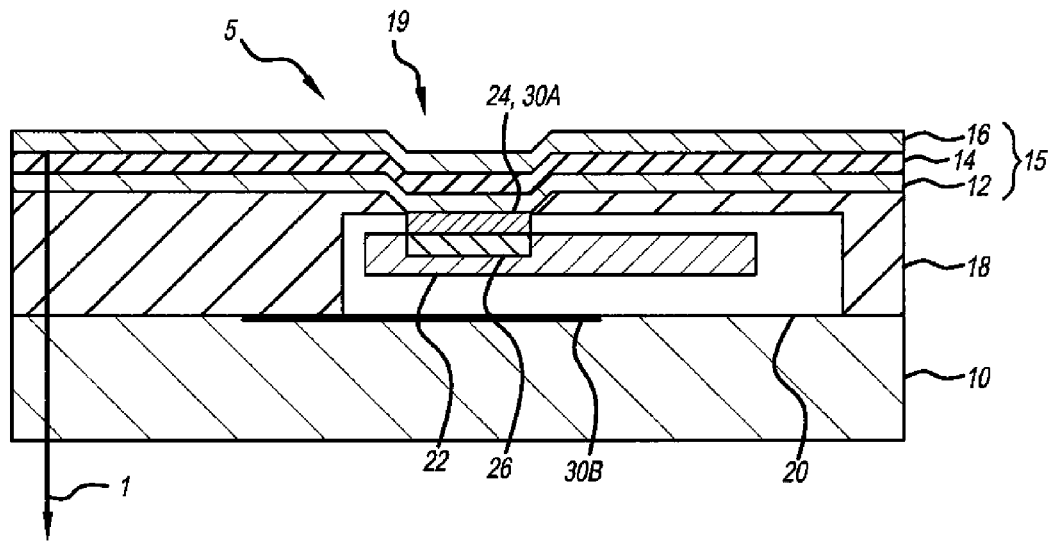
FIG. 1 is a partial cross section of a chiplet having two light shields according to an embodiment of the present invention.

Because the various layers and elements in the drawings have greatly different sizes, the drawings are not to scale.

DETAILED DESCRIPTION OF THE INVENTION

Referring to FIG. 1, according to one embodiment of the present invention, a light-emitting diode display device includes a transparent substrate 10, a plurality of pixels 5 formed on the transparent substrate 10, each pixel 5 including a transparent electrode 12 formed over the transparent substrate 10, one or more layers 14 of light-emitting material formed over the transparent electrode 12, and a reflective electrode 16 formed over the one or more layers of light-emitting material to from a diode 15 in a bottom-emitter design. In other embodiments of the present invention, the electrode 16 can be transparent and the substrate 10 opaque to provide a top-emitter design. In a design that emits light from both sides of the display, both the electrode 16 and the substrate 10 can be transparent.

Figure 2:
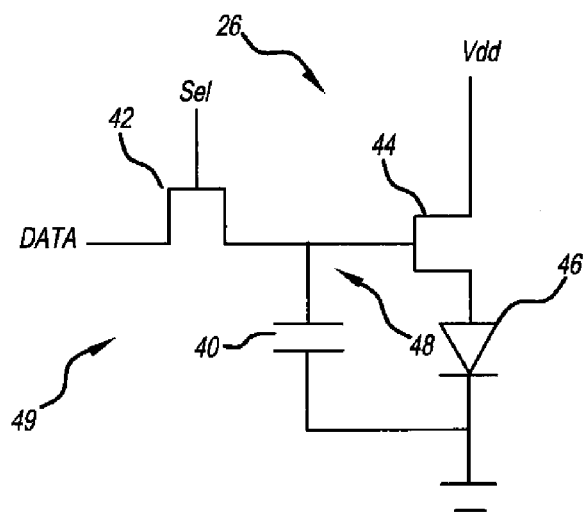
FIG. 2 is a schematic of an OLED drive circuit illustrating light illumination useful in understanding the present invention.

A plurality of chiplets 20 are located over the transparent substrate 10 between the transparent electrode 12 and the transparent substrate 10, each chiplet 20 including drive circuitry 26 for driving the pixel 5 to emit light 1. Referring to FIG. 2, in one embodiment, the drive circuitry 26 can include a select transistor 42 for depositing charge in a capacitor 40. The voltage across the capacitor 40 controls a drive transistor 44 to drive an OLED 46. Ambient light illumination 49 or OLED light illumination 48 on at least a portion of the drive circuitry 26 causes it to leak charge, thereby reducing the driving voltage of the drive transistor 44 and therefore the current through the OLED 46. Other drive circuits are known in the art and are included in the present invention.

A connection pad 24 forming a first light shield 30A separate from the drive circuitry 26 located on the surface of each chiplet 20 is disposed over the drive circuitry 26 and substantially shields at least a portion of the drive circuitry 26 from illumination. The connection pad 24 is electrically connected to the drive circuitry 26. A second light shield 30B is disposed under the drive circuitry 26 between the drive circuitry 26 and the transparent substrate 10 to shield at least a portion of the drive circuitry 26 from illumination. Illumination of the drive circuitry 26 includes either or both of ambient light illumination 49 or OLED light illumination 48 from light emitted by the one or more layers 14 of light-emitting material.

The performance of various circuit elements can be affected by light illumination and it is therefore useful to shield various components of the drive circuitry 26, or all of the drive circuit 26. Additional circuitry 22 can be employed to control the chiplet and pixel 5. A connection pad 24 can be formed on the surface of the chiplet 20 to connect the drive circuit 26 to the transparent electrode 12 and additional connection pads (not shown in FIG. 1) can be used to connect wires to the chiplet from an external controller, for example signal wires, and power and ground lines. The chiplet surface can be planarized and the chiplet 20 adhered to the substrate 10 with an adhesive planarization layer 18. More planarization material can be deposited in a second step to cover the chiplet 20. A via 19, can be photolithographically formed over the connection pad 24 to provide access to the connection pad 24 for the transparent electrode 12 through the adhesive planarization layer 18. The reflective electrode 16 can be electrically common to a plurality of pixels.

A variety of driver circuits 26 can be employed in various embodiments of the present invention. In one prior-art design illustrated in FIG. 2, each pixel employs two transistors and a capacitor. The first transistor 42 is responsive to signal lines (e.g. select and data signals) to deposit a charge in the capacitor 40. The second transistor 44 drives the LED device 46 to emit light in response to the charge stored in the capacitor 40. Alternative circuits can employ more than two transistors and more than one capacitor, for example. Driver circuit physical and electrical modeling has demonstrated that the primary mechanism for temporal non-uniformity of the LED current in an active-matrix design is the discharge of charge stored in storage capacitors (e.g. 40) constructed in the silicon substrate of the chiplet 20 due to ambient and OLED illumination of the driver circuit 26. It is therefore advantageous to shield the entire driver circuit 26, and particularly any circuit elements that discharge the capacitor 40. It is also useful to shield any elements whose performance changes as a result of illumination.

It has been demonstrated that an active-matrix drive circuit 26, such as that illustrated in FIG. 2, is temporally responsive to illumination. In particular, when charge is deposited in the capacitor 40 and the select signal is not active, the control transistor 42 leaks current at a significant rate when the control transistor 42 is illuminated. Physical modeling demonstrates that the charge leakage when the device is illuminated can increase by a factor of 100 million when compared to the charge leakage when the device is not illuminated. The model employed 623 nm light at 5 W/cm². In one circuit design using a 54 fF storage capacitor in a two-transistor, single capacitor circuit with a maximum 3V drive signal, the storage capacitor can discharge in about 32 microseconds. When the storage capacitor 40 is refreshed at an increased frequency so that less time is available for charge leakage, the change in LED 46 emission is reduced, showing that the charge loss in the capacitor 40 is likewise reduced. Illumination of the drive transistor 44 is also demonstrated to increase the current passing through the OLED element 46 independently of any change in the gate voltage (or capacitor charge). Hence, in the embodiment of FIG. 2, by shielding the control transistor 42 or drive transistor 46, unwanted changes in device performance due to drive circuit illumination are reduced.

According to various embodiments of the present invention, a chiplet active-matrix circuit provides greatly improved performance, for example in uniformity, response, frequency, current, and size. It is also preferred to employ a single wiring layer above the chiplets 20 over the planarization layer 18, to reduce manufacturing steps and cost. Hence, for a chiplet 20 whose surface is largely covered with connection pads 24, it is not possible to shield the chiplet 20 with wiring, as is suggested in U.S. Pat. No. 6,636,284 cited above. Moreover, as is also suggested in U.S. Pat. No. 6,636,284, employing a metal capacitor layer requires the construction of a multilayer, multi-element circuit with increased complexity, processing steps, and cost. Furthermore, chiplets are much thicker than thin-film transistors and the use of a small metal capacitor layer, or a metal transistor gate will not provide adequate shielding for light that can enter into the chiplet on the side, bottom, or at an angle to the chiplet surface. The present invention provides improved shields suitable for chiplet active-matrix circuits that provide a greater degree of light shielding without increasing process steps. Hence, the present invention improves on the prior art by simultaneously providing higher electrical performance, reduced susceptibility to light illumination, reduced circuit layout complexity and cost, and increased flexibility in device layout.

Figure 3:
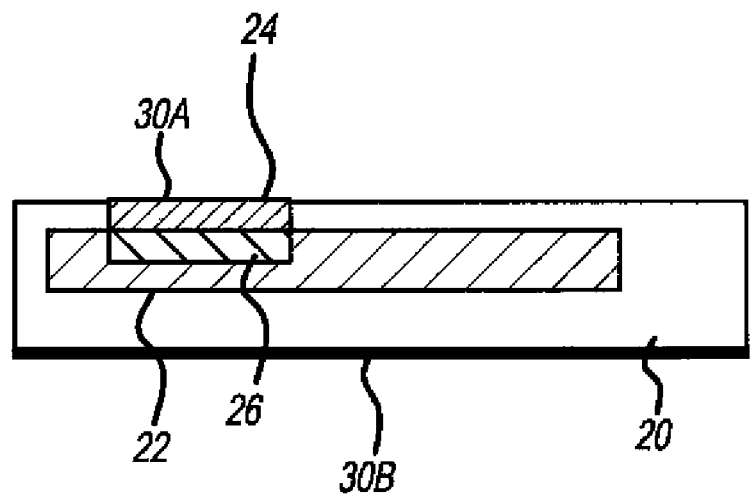
FIG. 3 is a cross section of a chiplet according to an embodiment of the present invention.
Figure 4:
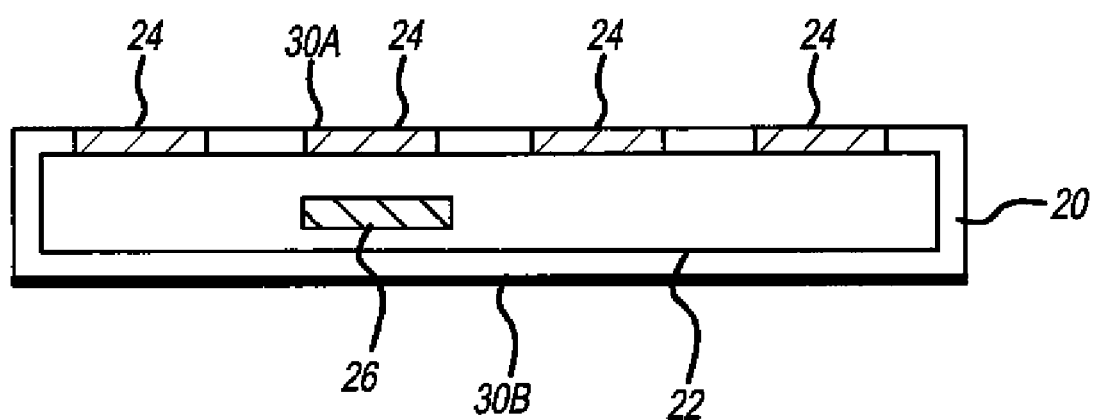
FIG. 4 is a cross section of a chiplet according to an alternative embodiment of the present invention.

According to various embodiments of the present invention, the driver circuitry 26 and the first and second light shields 30A and 30B can be positioned in somewhat different locations or be formed on different surfaces or comprise different materials. The second light shield 30B can comprise, for example, a metal layer photolithographically patterned on the substrate 10. Alternatively, the second light shield 30B can comprise, for example, a black resin layer patterned on the substrate 10. The black resin layer can then usefully serve as a black matrix for absorbing incident ambient light and thereby improve the contrast ratio of the display device. The black resin layer can also be an adhesive and adhere the chiplet 20 to the substrate 10. Referring to FIG. 3, in an alternative embodiment of the present invention, the second light shield 30B can be formed on the side of the chiplet 20 adjacent to the substrate. A metal layer can be formed on the chiplet 20, for example, or a light-absorbing material (such as a resin) or a light-absorbing adhesive. Alternatively, a metal layer can be formed in the chiplet between the driver circuitry 26 and the substrate 10. The second light shield 30B can cover the entire side of the chiplet 20 (as shown in FIGS. 3 and 4) or only a portion of the chiplet 20 (as shown in FIG. 1). The second light shield 30B can extend beyond the chiplet 20 on at least one side over the substrate 10 (as shown in FIG. 1) on any or all of the sides of the chiplet 20, thereby more effectively shielding the drive circuitry 26.

The connection pad 24 is opaque (for example comprising metal or having a metal layer). The light shield 30A shields at least a portion of the driver circuitry 26 located beneath the connection pad 24. Alternatively, the light shield 30A can shield an entire driver circuit 26. Typical integrated circuits include metal for connecting circuit components (e.g. transistors, capacitors) that can be employed for this purpose. A chiplet 20 can include multiple connection pads 24 for connecting to external buss lines, as shown in FIG. 4.

According to an embodiment of the present invention, the substrate 10 and the planarization and adhesive material 18 are transparent. The chiplet 20 provides a voltage differential to the electrodes 12, 16, causing current to flow through the one or more organic layers 14 and emit light. The light passes through the transparent electrode 12, the planarization layer 18, and the substrate 10 and is emitted from the device. Alternatively, light can be emitted from the one or more organic layers 14 toward the reflective electrode 16, is reflected from the reflective electrode 16, passes through the one or more organic layers 14, through the transparent electrode 12, the planarization layer 18, and the substrate 10 and is emitted from the device. Because the one or more organic layers have a relatively high refractive index (e.g. 1.6 to 1.7) and the transparent electrode has a high refractive index (e.g. comprising ITO with a refractive index of 1.8 to 2.2), light is trapped by total internal reflection in these layers. Furthermore, depending on the angle of emission from the one or more organic layers 14, light is trapped in the planarization layer 18 and substrate 10. Planarization layers typically comprise a transparent resin material with an optical index of approximately 1.5, and the substrate 10 typically includes glass and has a similar optical index of approximately 1.5. Hence, the trapped light can travel through the OLED layers 12, 14 planarization layer 18, and even in the substrate 10 and, in the absence of the light shields 30A and 30B of the present invention, strike the driver circuitry 26 to deleteriously affect the circuit performance.

Figure 5:
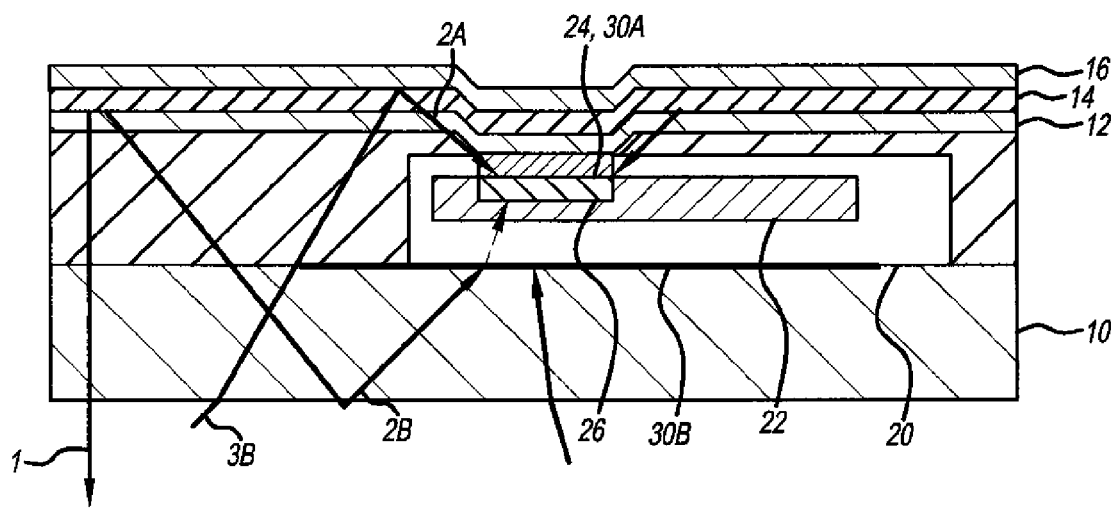
FIG. 5 is a partial cross section of a chiplet having two light shields and illustrating light rays according to an embodiment of the present invention.

The present invention provides stable and consistent drive circuit performance in the presence of both ambient and emitted light. Referring to FIG. 5, ambient light can pass through the substrate 10 and the chiplet 20. In the absence of the second light shield 30B, the ambient light would be incident upon the drive circuitry 26, causing the drive circuitry 26 to functionally depend on the level of incident ambient light. According to the present invention, however, the incident ambient light 3A is absorbed or reflected by the second light shield 30B. Because of the particular construction of an OLED device, incident ambient light 3B would also illuminate the driver circuitry 26 by reflection from the reflective electrode 16. The first light shield 30A absorbs the reflected ambient illumination 3B.

Light emitted from the LED device can also detrimentally illuminate the driver circuitry 26. According to the present invention, light 2A emitted from the one or more organic layers 14 which would illuminate the driver circuitry 26 is instead absorbed by the first light shield 30A. Light 2B emitted from the one or more organic layers 14 but trapped, due to total internal reflection, in the substrate 10, transparent electrode 12, and one or more organic layers 14 which would also illuminate the driver circuitry 26 is instead absorbed by the second light shield 30B. Light emitted toward the reflective electrode 16 is reflected and can follow one of the light paths 1, 2A, or 2B.

Figure 6:
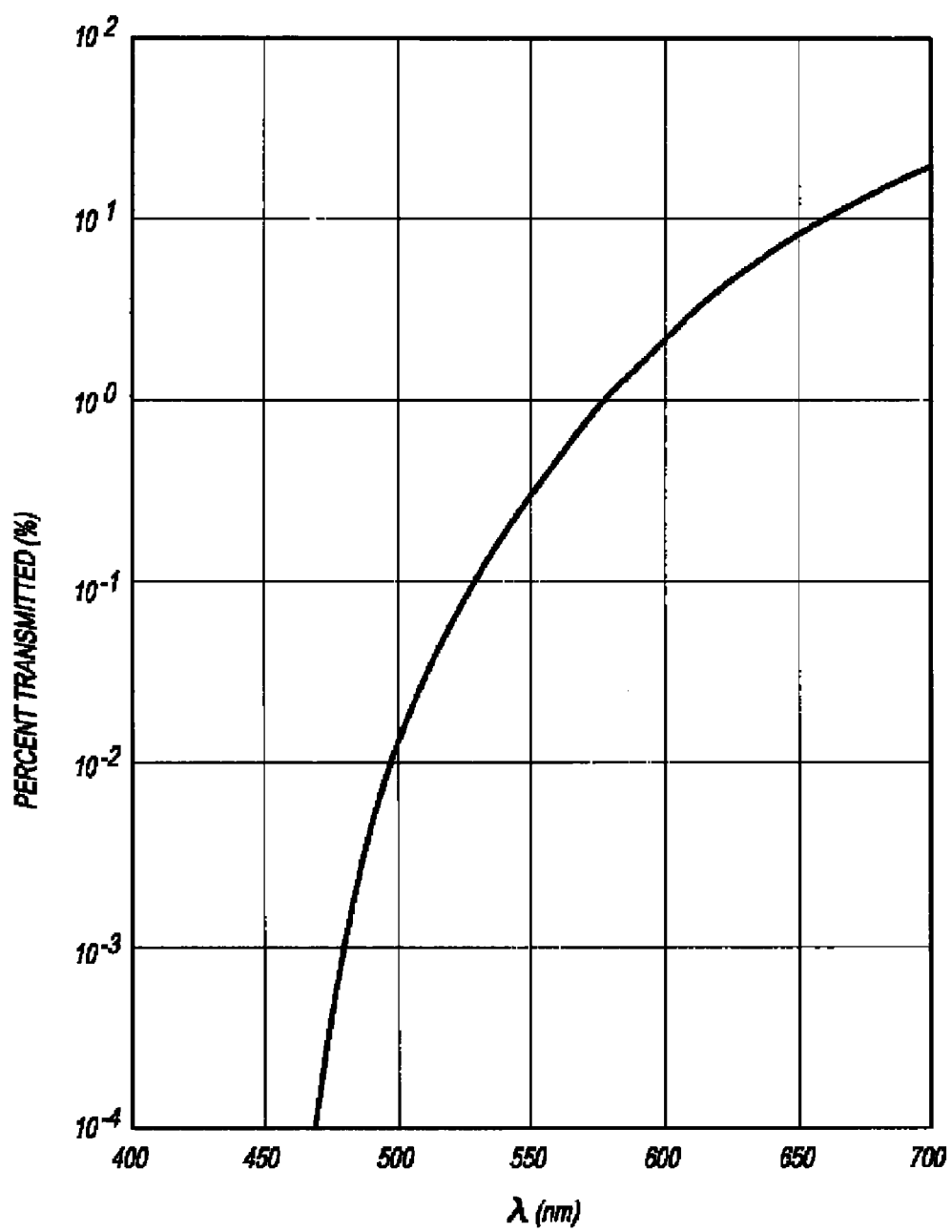
FIG. 6 is a graph illustrating the transparency of crystalline silicon useful in understanding the present invention.
Figure 7:
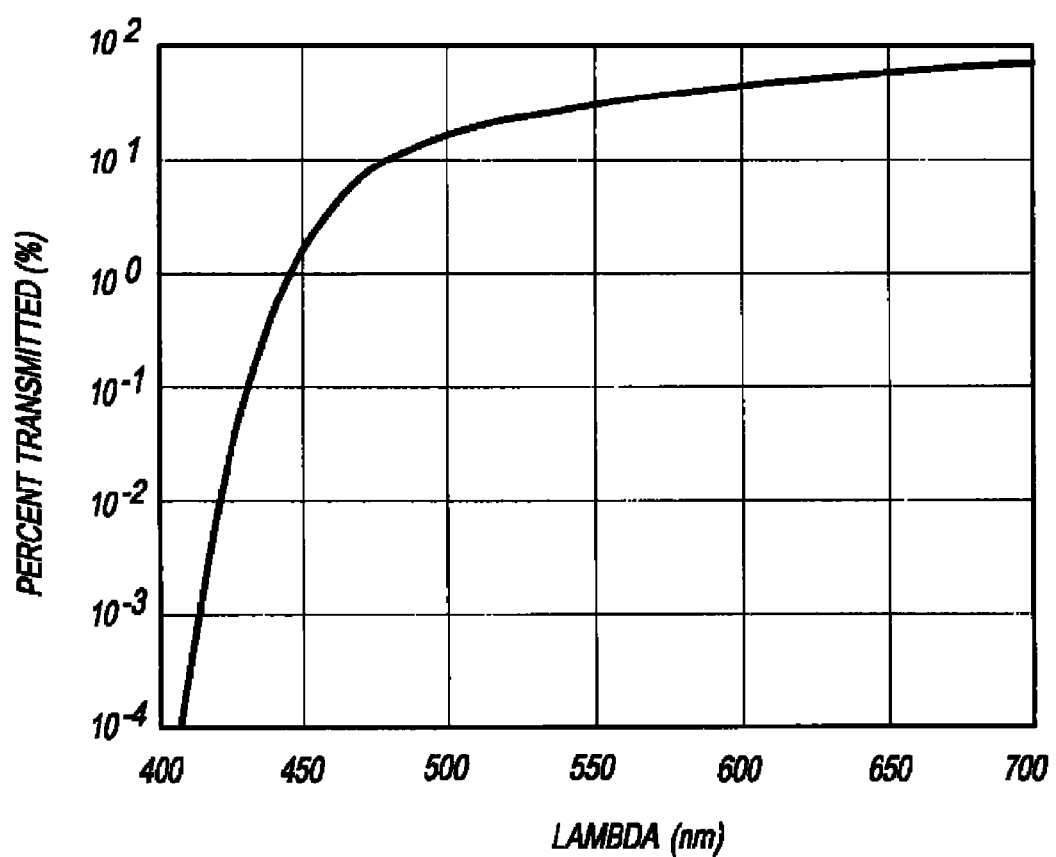
FIG. 7 is another graph illustrating the transparency of crystalline silicon useful in understanding the present invention.

According to the embodiments of the present invention, both first and second light shields 30A, 30B are necessary. Chiplets, as described below, can employ a crystalline silicon substrate thickness of less than 50, less than 25 microns, less than 15 microns, less than 12 microns and even less than 10 microns. Chiplets with an approximate thickness of 8 microns have been constructed and employed in active-matrix OLED displays. At these thicknesses, crystalline thickness has a substantial transparency. Referring to FIG. 6 and FIG. 7, the transmissivity spectrum of crystalline silicon is graphed for substrate thicknesses of 10 microns and 2 microns, respectively. Circuitry formed in the chiplet 20 extends into the substrate up to 8 microns, or even more depending on the process, the circuitry, and the number of layers required for the circuitry 22. Hence, driver circuits 26 can be physically near the chiplet 20 side adjacent to the substrate 10 and incident ambient light (in the absence of the second light shield 30B) can pass into the crystalline silicon a sufficient distance to illuminate the driver circuit 26 and affect the behavior of the driver circuit 26. Likewise, the planarization layer 18 is transparent so that light 1 can be emitted from the device. Since the crystalline silicon comprising the chiplet 20 has an optical index higher than that of the substrate 10 or planarization layer 18, light 2B trapped in the substrate 10 incident on the chiplet 20 will enter the chiplet 20 to illuminate the driver circuit 26 as shown by the dashed arrow), in the absence of the second light shield 30B.

Figure 8:
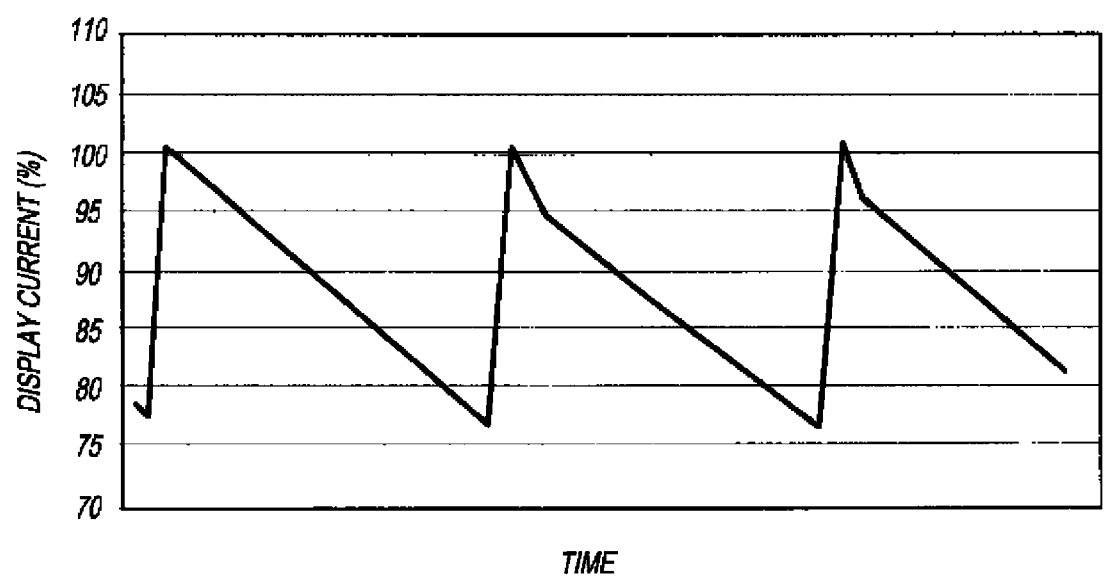
FIG. 8 is a graph illustrating the effect of emitted light on a chiplet driver circuit in an active-matrix bottom-emitter OLED device.

An active-matrix OLED display device having chiplet pixel control has been constructed. The chiplets had crystalline silicon substrates and were approximately 8 microns thick. The OLED structure described in FIG. 1 was constructed, but without the first and second light shields. The light output of the emitting layers has been demonstrated to vary depending on the ambient illumination incident upon the display. Referring to FIG. 8, the change in display current (corresponding to luminance) for the OLED structure over time due to emission from the OLED elements is shown. No light shield is present in the test of FIG. 8. As shown in FIG. 8, the OLED device current is reduced by more than 20% over time, until it is refreshed. The test was performed with a refresh of 60 Hz, a maximum display current of 1.3 mA, and a current density of 3.2 mA/cm$^2$ in the OLED device of FIG. 1. By refreshing more frequently, less time is provided for the capacitor to discharge and a greater current used corresponding to a more consistent light output over time. The table below shows the total device current used for a full frame.

| 60 Hz refresh | 3.62 mA |
| 800 Hz refresh | 4.78 mA |

In a second experiment, by locating a light shield over the device, no change in display current is seen as ambient illumination is changed.

Each chiplet 20 can include circuitry 22 for controlling the pixels 5 to which the chiplet 20 is connected through connection pads 24. The circuitry 22 can include storage elements that store a value representing a desired luminance for each pixel 5 to which the chiplet 20 is connected, the chiplet 20 using such value to control the pixel 5 to emit light. In yet another embodiment of the present invention, one or two storage elements can be employed for each light-emitting element to which the chiplet 20 is connected. A controller for the display device can provide control and data signals through buss lines connected to the chiplet connection pads for driving the pixels to emit image-wise light. The controller can be implemented as a chiplet and affixed to the substrate 10. The controller can be located on the periphery of the substrate 10, or can be external to the substrate 10 and comprise a conventional integrated circuit.

According to various embodiments of the present invention, the chiplets 20 can be constructed in a variety of ways, for example with one or two rows of connection pads 24 along a long dimension of a chiplet 20. Interconnection busses can be formed from various materials and use various methods for deposition on the device substrate. For example, the interconnection busses can be metal, either evaporated or sputtered, for example aluminum or aluminum alloys. Alternatively, the interconnection busses can be made of cured conductive inks or metal oxides. In one cost-advantaged embodiment, the interconnection busses are formed in a single layer.

The present invention is particularly useful for multi-pixel device embodiments employing a large device substrate, e.g. glass, plastic, or foil, with a plurality of chiplets 20 arranged in a regular arrangement over the device substrate 10. Each chiplet 20 can control a plurality of pixels 5 formed over the device substrate 10 according to the circuitry in the chiplet 20 and in response to control signals. Individual pixel groups or multiple pixel groups can be located on tiled elements, which can be assembled to form the entire display.

According to the present invention, chiplets 20 provide distributed pixel control elements over a substrate 10. A chiplet 20 is a relatively small integrated circuit compared to the device substrate 10 and includes a circuit 22 including wires, connection pads 24, passive components such as resistors or capacitors, or active components such as transistors or diodes, formed on an independent substrate. Chiplets 20 are separately manufactured from the display substrate 10 and then applied to the display substrate 10. The chiplets 20 are preferably manufactured using silicon or silicon on insulator (SOI) wafers using known processes for fabricating semiconductor devices. Each chiplet 20 is then separated prior to attachment to the device substrate 10. The crystalline base of each chiplet 20 can therefore be considered a substrate separate from the device substrate 10 and over and in which the chiplet circuitry 22 is disposed. The plurality of chiplets 20 therefore has a corresponding plurality of substrates separate from the device substrate 10 and each other. In particular, the independent substrates are separate from the substrate 10 on which the pixels 5 are formed and the areas of the independent, chiplet substrates, taken together, are smaller than the device substrate 10. Chiplets 20 can have a crystalline substrate to provide higher performance active components than are found in, for example, thin-film amorphous or polycrystalline silicon devices. Chiplets 20 can have a thickness preferably of 100 um or less, and more preferably 20 um or less. This facilitates formation of the adhesive and planarization material 18 over the chiplet 20 that can then be applied using conventional spin-coating techniques. According to one embodiment of the present invention, chiplets 20 formed on crystalline silicon substrates are arranged in a geometric array and adhered to a device substrate (e.g. 10) with adhesion or planarization materials. Connection pads 24 on the surface of the chiplets 20 are employed to connect each chiplet 20 to signal wires, power busses and pixel electrodes (16, 12) to drive pixels 5. Chiplets 20 can control at least four pixels 5.

Since the chiplets 20 are formed in a semiconductor substrate, the circuitry of the chiplet can be formed using modern lithography tools. With such tools, feature sizes of 0.5 microns or less are readily available. For example, modern semiconductor fabrication lines can achieve line widths of 90 nm or 45 nm and can be employed in making the chiplets of the present invention. The chiplet 20, however, also requires connection pads 24 for making electrical connection to the wiring layer provided over the chiplets once assembled onto the display substrate 10. The connection pads 24 are sized based on the feature size of the lithography tools used on the display substrate 10 (for example 5 um) and the alignment of the chiplets 20 to the wiring layer (for example +/−5 um). Therefore, the connection pads 24 can be, for example, 15 um wide with 5 um spaces between the pads. This means that the pads will generally be significantly larger than the transistor circuitry formed in the chiplet 20.

The pads can generally be formed in a metallization layer on the chiplet over the transistors. It is desirable to make the chiplet with as small a surface area as possible to enable a low manufacturing cost.

By employing chiplets with independent substrates (e.g. comprising crystalline silicon) having circuitry with higher performance than circuits formed directly on the substrate (e.g. amorphous or polycrystalline silicon), a device with higher performance is provided. Since crystalline silicon has not only higher performance but also much smaller active elements (e.g. transistors), the circuitry size is much reduced. A useful chiplet can also be formed using micro-electro-mechanical (MEMS) structures, for example as described in "A novel use of MEMS switches in driving AMOLED", by Yoon, Lee, Yang, and Jang, Digest of Technical Papers of the Society for Information Display, 2008, 3.4, p. 13.

The device substrate 10 can comprise glass and the wiring layers made of evaporated or sputtered metal or metal alloys, e.g. aluminum or silver, formed over a planarization layer (e.g. resin) patterned with photolithographic techniques known in the art. The chiplets 20 can be formed using conventional techniques well established in the integrated circuit industry.

The present invention can be employed in devices having a multi-pixel infrastructure. In particular, the present invention can be practiced with LED devices, either organic or inorganic, and is particularly useful in information-display devices. In a preferred embodiment, the present invention is employed in a flat-panel OLED device composed of small-molecule or polymeric OLEDs as disclosed in, but not limited to U.S. Pat. No. 4,769,292, issued Sep. 6, 1988 to Tang et al., and U.S. Pat. No. 5,061,569, issued Oct. 29, 1991 to VanSlyke et al. Inorganic devices, for example, employing quantum dots formed in a polycrystalline semiconductor matrix (for example, as taught in US Publication 2007/0057263 by Kahen), and employing organic or inorganic charge-control layers, or hybrid organic/inorganic devices can be employed. Many combinations and variations of organic or inorganic light-emitting displays can be used to fabricate such a device, including active-matrix displays having either a top- or a bottom-emitter architecture.

The invention has been described in detail with particular reference to certain preferred embodiments thereof, but it should be understood that variations and modifications can be effected within the spirit and scope of the invention.

PARTS LIST

| | |
|---|---|
| 1 | emitted light |
| 2A | incident emitted light |
| 2B | trapped and incident emitted light |
| 3A | ambient incident light |

-continued

PARTS LIST

| | |
|---|---|
| 3B | reflected ambient incident light |
| 5 | pixel |
| 10 | substrate |
| 12 | transparent electrode |
| 14 | layers of light-emissive material |
| 15 | light-emitting diode |
| 16 | reflective electrode |
| 18 | planarization layer |
| 19 | via |
| 20 | chiplet |
| 22 | circuitry |
| 24 | connection pad |
| 26 | drive circuit |
| 30A | first light shield |
| 30B | second light shield |
| 40 | capacitor |
| 42 | control transistor |
| 44 | drive transistor |
| 46 | OLED |
| 48 | OLED light illumination |
| 49 | ambient light illumination |

The invention claimed is:

1. A light-emitting diode display device, comprising:
   a) a transparent substrate;
   b) a plurality of pixels formed on the substrate, each pixel including a transparent electrode formed over the transparent substrate, one or more layers of light-emitting material formed over the transparent electrode, and an electrode formed over the one or more layers of light-emitting material;
   c) a plurality of chiplets located over the substrate between the transparent electrode and the substrate, each chiplet including drive circuitry for driving the pixel to emit light, the drive circuitry including a storage capacitor for storing charge and wherein light illumination of at least a portion of the drive circuit causes the capacitor to leak charge;
   d) a connection pad forming a first light shield separate from the drive circuitry located on the surface of each chiplet disposed over the drive circuitry and substantially shielding at least a portion of the drive circuitry from illumination, the connection pad electrically connected to the drive circuitry; and
   e) a second light shield disposed under the drive circuitry between the drive circuitry and the substrate to shield at least a portion of the drive circuitry from illumination, wherein the second light shield includes a black material layer applied to the side of the chiplets between the drive circuitry and the substrate.

2. The light-emitting diode display device of claim 1, wherein the illumination is ambient illumination originating externally to the light-emitting diode display device.

3. The light-emitting diode display device of claim 1, wherein the illumination is light emitted by the one or more layers of light-emitting material.

4. The light-emitting diode display device of claim 1, wherein the first and second light shields shield the capacitor from illumination.

5. The light-emitting diode display device of claim 1, wherein the black material layer includes a patterned metal layer.

6. The light-emitting diode display device of claim 1, wherein the black material layer includes a patterned black resin layer.

7. The light-emitting diode display device of claim 6, wherein the patterned black resin layer includes an adhesive.

8. The light-emitting diode display device of claim 1, wherein the connection pad includes a metal layer.

9. The light-emitting diode display device of claim 1, wherein the chiplet comprises silicon and has a thickness less than 50 microns.

10. The light-emitting diode display device of claim 1, wherein the chiplet comprises silicon and has a thickness less than 25 microns.

11. The light-emitting diode display device of claim 1, wherein the chiplet comprises silicon and has a thickness less than 15 microns.

12. The light-emitting diode display device of claim 1, wherein the light-emitting diode display is an organic light-emitting diode display.

13. The light-emitting diode display device of claim 1, wherein the drive circuitry further includes a control transistor and wherein the control transistor is shielded from illumination by the first or second light shields.

14. The light-emitting diode display device of claim 1, wherein the drive circuitry further includes a drive transistor and wherein the drive transistor is shielded from illumination by the first or second light shields.

15. The light-emitting diode display device of claim 1, wherein the electrode is reflective and the substrate is transparent.

16. A light-emitting diode display device, comprising:
a) a transparent substrate;
b) a plurality of pixels formed on the substrate, each pixel including a transparent electrode formed over the transparent substrate, one or more layers of light-emitting material formed over the transparent electrode, and an electrode formed over the one or more layers of light-emitting material;
c) a plurality of chiplets located over the substrate between the transparent electrode and the substrate, each chiplet including drive circuitry for driving the pixel to emit light, the drive circuitry including a storage capacitor for storing charge and wherein light illumination of at least a portion of the drive circuit causes the capacitor to leak charge;
d) a connection pad forming a first light shield separate from the drive circuitry located on the surface of each chiplet disposed over the drive circuitry and substantially shielding at least a portion of the drive circuitry from illumination, the connection pad electrically connected to the drive circuitry; and
e) a second light shield disposed under the drive circuitry between the drive circuitry and the substrate to shield at least a portion of the drive circuitry from illumination, wherein the second light shield includes a metal layer within the chiplet.

* * * * *